US012724085B2

(12) United States Patent
Cho et al.

(10) Patent No.: US 12,724,085 B2
(45) Date of Patent: Sep. 1, 2026

(54) BATTERY MANAGEMENT SYSTEM AND METHOD FOR CONTROLLING THE SAME

(71) Applicant: HYUNDAI MOBIS CO., LTD., Seoul (KR)

(72) Inventors: Yeon Ho Cho, Yongin-si (KR); Si Il Kim, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 409 days.

(21) Appl. No.: 18/498,167

(22) Filed: Oct. 31, 2023

(65) Prior Publication Data

US 2024/0142541 A1 May 2, 2024

(30) Foreign Application Priority Data

Nov. 1, 2022 (KR) ........................ 10-2022-0143905

(51) Int. Cl.
*G01R 31/396* (2019.01)
*G01R 31/3842* (2019.01)

(52) U.S. Cl.
CPC ....... *G01R 31/396* (2019.01); *G01R 31/3842* (2019.01)

(58) Field of Classification Search
CPC ... G01R 31/396; G01R 31/3842; Y02E 60/10; B60L 58/12; B60L 58/10; B60L 3/12; B60L 2260/50; B60L 3/0046; B60L 53/80; B60L 2240/547; B60L 2240/549; B60L 2250/10; Y02T 10/70; Y02T 10/7072; Y02T 10/72
See application file for complete search history.

(56) References Cited

U.S. PATENT DOCUMENTS

| | | | |
|---|---|---|---|
| 2019/0113578 A1* | 4/2019 | Um | G01R 31/3842 |
| 2023/0010270 A1* | 1/2023 | Yamaguchi | H01M 10/482 |
| 2024/0103085 A1* | 3/2024 | Kang | G01R 31/3835 |
| 2025/0147113 A1* | 5/2025 | Song | G01R 31/371 |
| 2025/0233440 A1* | 7/2025 | Nakao | H02J 7/80 |
| 2025/0293324 A1* | 9/2025 | Osada | H01M 4/525 |

OTHER PUBLICATIONS

Hwang, J-C., and et al. “Measurement method for online battery early faults precaution in uninterrupted power supply system.” IET Electric Power Applications 5, No. 3 (2011): 267-274 (Year: 2011).*

* cited by examiner

*Primary Examiner* — Douglas Kay
(74) *Attorney, Agent, or Firm* — NSIP Law

(57) ABSTRACT

A battery management system includes a battery state manager that senses and manages state information of a battery, and a controller that identifies a battery voltage reduction time from the state information of the battery when a voltage of the battery decreases by a predetermined value, and predicts a usable time of the battery based on a change in the battery voltage reduction time.

13 Claims, 6 Drawing Sheets

FIG.4A
411
145
PLEASE REPLACE
AGED BATTERY

BATTERY MANAGEMENT SYSTEM AND METHOD FOR CONTROLLING THE SAME

CROSS-REFERENCE TO RELATED APPLICATION

This application claims the benefit of priority to Korean Patent Application No. 10-2022-0143905, filed in the Korean Intellectual Property Office on Nov. 1, 2022, the entire contents of which are incorporated herein by reference.

TECHNICAL FIELD

The present disclosure relates to a battery management system and a method for controlling the same.

BACKGROUND

A battery generates electrical energy to supply power necessary for driving a vehicle. In this regard, the battery supplies the power to the vehicle by repeating charging and discharging. As time passes, the battery ages, and a battery performance deteriorates, such as a loss of an amount of current charged in the battery.

For example, the battery may be a lithium-ion battery (Li-ion battery). Because of characteristics of the lithium-ion battery, when charging and discharging cycles are repeated several times, the amount of current flowing into the battery decreases to about 60% of an initial capacity (a rated capacity), and a usable time of the battery also gradually decreases.

Accordingly, a periodic battery replacement is required, and battery state information is provided such that a user may identify a battery state.

However, as the battery performance deteriorates, the usable time of the battery gradually decreases, and as a result, an error occurs between the usable time of the battery initially provided to the user and an actual usable time.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

The present disclosure has been made to solve the above-mentioned problems occurring in the prior art while advantages achieved by the prior art are maintained intact.

An aspect of the present disclosure provides a battery management system and a method for controlling the same that may continuously calculate a battery voltage reduction change rate based on a battery voltage reduction time and predict a battery usable time by reflecting the calculated battery voltage reduction change rate, so that even when a voltage reduction becomes faster because of aging of a battery, a user may be informed of the accurate usable time.

Another aspect of the present disclosure provides a battery management system and a method for controlling the same that may identify an aged state of a battery based on a battery voltage reduction change rate and inform a user of the identified aged state, so that the user may rapidly recognize a state of the battery.

The technical problems to be solved by the present disclosure are not limited to the aforementioned problems, and any other technical problems not mentioned herein will be clearly understood from the following description by those skilled in the art to which the present disclosure pertains.

In one general aspect, a battery management system includes a battery state manager that senses and manages state information of a battery, and a controller that identifies a battery voltage reduction time from the state information of the battery when a voltage of the battery decreases by a predetermined value, and predicts a usable time of the battery based on a change in the battery voltage reduction time.

In one implementation, the battery management system may further include storage that stores current state information of at least one of the voltage, a current, and a state of charging of the battery sensed by the battery state manager.

In one implementation, the battery state manager may store, in the storage, the current state information of the battery about the battery voltage reduction time required for the voltage of the battery to decrease by the predetermined value, the current, and the state of charging of the battery when the voltage of the battery decreases by the predetermined value.

In one implementation, the battery state manager may store initial state information of the battery recognized when the battery is mounted or replaced in the storage.

In one implementation, the controller may calculate a battery voltage reduction change rate by comparing the current state information of the battery stored in the storage with the initial state information of the battery when the voltage of the battery decreases by the predetermined value.

In one implementation, the controller may calculate the battery voltage reduction change rate based on a value obtained by dividing a first battery voltage reduction time identified from the current state information of the battery by a second battery voltage reduction time identified from the initial state information of the battery.

In one implementation, the controller may predict the usable time of the battery based on the state of charging and an operating current of the battery and the battery voltage reduction change rate.

In one implementation, the controller may predict the usable time of the battery by applying the battery voltage reduction change rate to a value obtained by dividing the state of charging of the battery by the operating current.

In one implementation, the controller may determine an aged state of the battery based on the battery voltage reduction change rate.

In one implementation, the controller may determine that the battery is aged when the battery voltage reduction change rate is smaller than a reference value.

In one implementation, the battery management system may further include an interface that outputs information on the usable time of the battery and the aged state of the battery.

In another general aspect, a method for controlling a battery management system includes sensing state information of a battery, and identifying a battery voltage reduction time from the state information of the battery when a voltage of the battery decreases by a predetermined value, and predicting a usable time of the battery based on a change in the battery voltage reduction time.

In one implementation, the method may further include storing current state information of the battery about the battery voltage reduction time required for the voltage of the battery to decrease by the predetermined value, a current, and a state of charging of the battery when the voltage of the battery decreases by the predetermined value.

In one implementation, the method may further include storing initial state information of the battery recognized when the battery is mounted or replaced before the storing of the current state information of the battery.

In one implementation, the predicting of the usable time of the battery may include calculating a battery voltage reduction change rate by comparing the current state information of the battery stored with the initial state information of the battery when the voltage of the battery decreases by the predetermined value.

In one implementation, the calculating of the battery voltage reduction change rate may include calculating the battery voltage reduction change rate based on a value obtained by dividing a first battery voltage reduction time identified from the current state information of the battery by a second battery voltage reduction time identified from the initial state information of the battery.

In one implementation, the predicting of the usable time of the battery may further include predicting the usable time of the battery based on the state of charging and an operating current of the battery and the battery voltage reduction change rate, and outputting an information message about the usable time of the battery.

In one implementation, the predicting of the usable time of the battery based on the state of charging and the operating current of the battery and the battery voltage reduction change rate may include predicting the usable time of the battery by applying the battery voltage reduction change rate to a value obtained by dividing the state of charging of the battery by the operating current.

In one implementation, the method may further include determining an aged state of the battery based on the battery voltage reduction change rate, and outputting a battery replacement notification message when the battery is aged.

In one implementation, the determining of the aged state of the battery may include determining that the battery is aged when the battery voltage reduction change rate is smaller than a reference value.

Other features and aspects will be apparent from the following detailed description, the drawings, and the claims.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
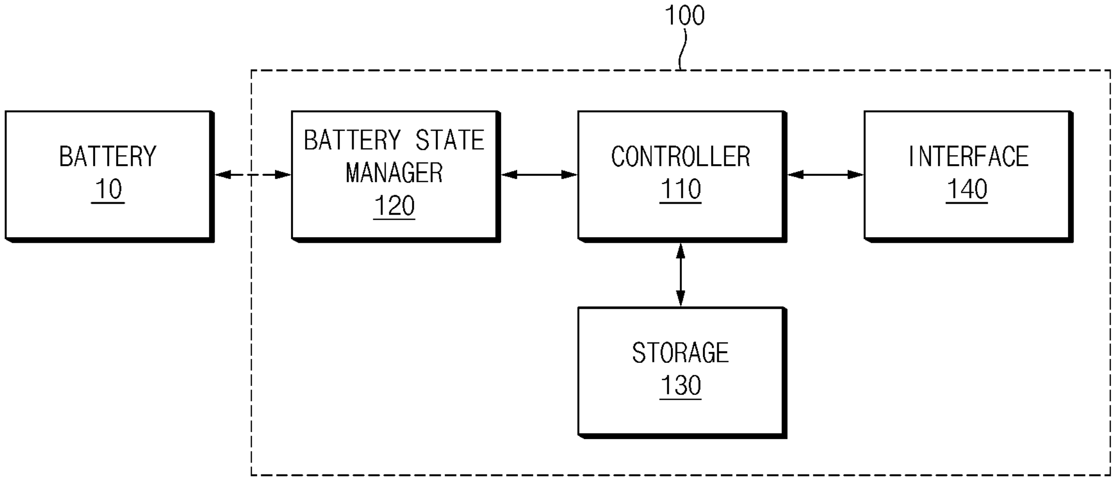
FIG. 1 is a diagram showing a configuration of a battery management system according to an embodiment of the present disclosure.

Hereinafter, some embodiments of the present disclosure will be described in detail with reference to the exemplary drawings. In adding the reference numerals to the components of each drawing, it should be noted that the identical or equivalent component is designated by the identical numeral even when they are displayed on other drawings. Further, in describing the embodiment of the present disclosure, a detailed description of the related known configuration or function will be omitted when it is determined that it interferes with the understanding of the embodiment of the present disclosure.

In describing the components of the embodiment according to the present disclosure, terms such as first, second, A, B, (a), (b), and the like may be used. These terms are merely intended to distinguish the components from other components, and the terms do not limit the nature, order or sequence of the components. Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram showing a configuration of a battery management system according to an embodiment of the present disclosure.

A battery management system 100 according to the present disclosure may be implemented in a form of an independent hardware device including a memory and a processor that processes each operation, or may be driven in a form of being included in another hardware device such as a microprocessor or a general-purpose computer system.

In this regard, the battery management system 100 may be formed integrally with control units inside a vehicle, or may be implemented as a separate device and connected to the control units of the vehicle by connection means.

Referring to FIG. 1, the battery management system 100 may include a controller 110, a battery state manager 120, storage 130, and an interface 140.

The controller 110 may be connected to each component of the battery management system 100 to perform overall functions related to management and operation of a battery 10. The controller 110 may be a hardware device such as a processor or a central processing unit (CPU), or a program implemented by the processor.

In this regard, the battery 10 may be a high-voltage battery that provides power necessary for the vehicle to operate. In one example, the battery 10 may be a low-voltage battery.

The battery 10 may be a battery pack constituted by cells connected to each other in series based on a required capacity of the battery 10. Such battery 10 may include a battery module having the plurality of battery cells connected to each other in series, and each of the battery cells may be implemented as a lithium battery cell.

The battery 10 may be constituted by a plurality of battery modules connected to each other in series and/or parallel.

The battery state manager 120 monitors a state of the battery 10, for example, a voltage, a current, and a state of charging (SoC) of the battery 10 in real time. The battery state manager 120 may include a sensor for sensing the state of the battery 10.

The battery state manager 120 may sense initial state information of the battery 10 and store the initial state information in the storage 130 when the battery 10 is mounted or replaced.

In this regard, the initial state information of the battery 10 may include information on a battery voltage reduction time or the like based on a total capacity, the current, and an operating current of the battery 10, and may further include information necessary for the operation of the battery 10. The capacity of the battery 10 may be defined to be 100% in a full charge voltage state and 0% in a shutdown voltage state.

In addition, the battery state manager 120 may monitor state information of the battery 10, and, for each predetermined period or when a specific event occurs, store state information of the battery 10 at the corresponding time point in the storage 130.

In this regard, the battery state manager 120 may monitor the state of charging (the voltage) of the battery 10 in real time or at a predetermined time interval, and, whenever the voltage of the battery 10 decreases by a predetermined value (V1), store state information of the battery 10 at the corresponding time point. For example, whenever the voltage of the battery 10 decreases by 0.1 [V], the battery state manager 120 may store a current of the battery 10 at the corresponding time point in the storage 130.

In this regard, the battery state manager 120 may store the information on the battery voltage reduction time required for the voltage of the battery 10 to decrease by V1, for example, 0.1 [V].

Figure 2:
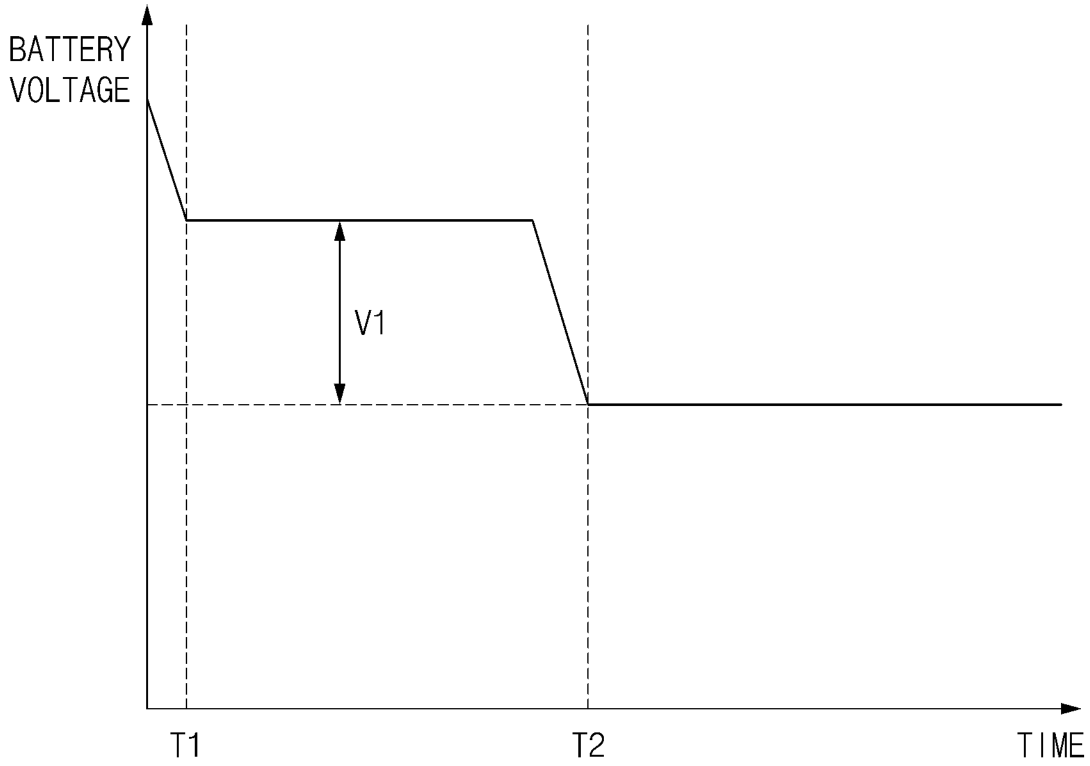
FIG. 2 is a diagram showing a battery voltage reduction time according to an embodiment of the present disclosure.

FIG. 2 is a diagram showing a battery voltage reduction time according to an embodiment of the present disclosure.

Referring to FIG. 2, the battery state manager 120 may store a current of the battery 10 at a second time point T2 at which the voltage of the battery 10 is reduced by V1 based on a first time point T1 and the information on the battery voltage reduction time required from the first time point T1 to the second time point T2 together.

The battery state manager 120 may store the state information of the battery 10 in the storage 130 whenever the voltage of the battery 10 decreases by the predetermined value, and transmit a state sensing signal to the controller 110 at the same time.

The storage 130 may store data and/or algorithms necessary for the battery management system 100 to operate. As an example, the storage 130 may store the initial state information of the battery 10, and may store the state information of the battery 10 sensed while the battery 10 is operating. In this regard, to secure a storage space of the battery 10, only recent 'm' state information of the battery 10 may be stored excluding the initial state information of the battery 10.

When the number of state information of the battery 10 stored in the storage 130 exceeds a predetermined number, the state information may be deleted except for the 'm' recently stored state information.

The storage 130 may include storage media such as a random access memory (RAM), a static random access memory (SRAM), a read-only memory (ROM), a programmable read-only memory (PROM), an electrically erasable programmable read-only memory (EEPROM), and the like.

During an initial operation of the battery 10, the controller 110 predicts a total time during which the battery 10 may be used (hereinafter, referred to as a 'battery total usable time') based on the initial state information of the battery 10 stored in the storage 130. The battery total usable time may be estimated based on a value obtained by dividing the total capacity of the battery 10 by the operating current.

In this regard, the controller 110 provides the user information on the predicted battery total usable time via the interface 140 during the initial operation of the battery 10.

The interface 140 may include input means for receiving a predetermined control command from the user and output means for outputting operating state and result and the like of the battery management system 100.

In this regard, the input means may include a key button or may include a soft key implemented on a display.

The output means may include the display, and may also include sound output means such as a speaker. In this regard, the display may be implemented in a form of a touch screen in which the input means and the output means are integrated with each other.

In this regard, the display may be implemented as a liquid crystal display (LCD), an organic light-emitting diode (OLED), a flexible display, a 3D display, and the like, and may be implemented in a form of a head-up display.

When receiving the state sensing signal from the battery state manager 120, the controller 110 may compare the state information of the battery 10 recently stored in the storage 130, that is, current state information of the battery 10 with the initial state information of the battery 10 to calculate a battery voltage reduction change rate, and predict a current usable time of the battery 10 (hereinafter, referred to as a 'battery usable time') based on the calculated battery voltage reduction change rate. The battery usable time may be predicted based on a value obtained by dividing a current state of charging of the battery 10 by the operating current.

Figure 3:
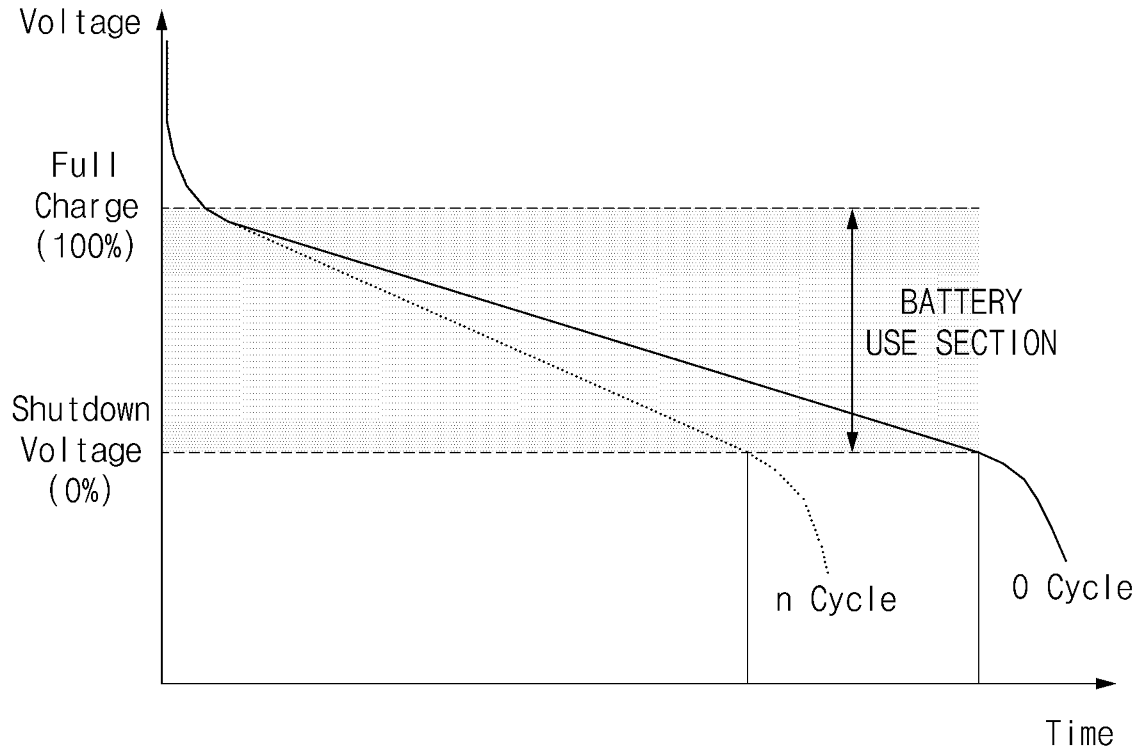
FIG. 3 is a diagram showing a change in a battery usable time according to an embodiment of the present disclosure.

FIG. 3 is a diagram showing a change in a battery usable time according to an embodiment of the present disclosure.

Referring to FIG. 3, a time required for the battery voltage to decrease from 100% to 0% gradually decreases as the number of operating cycles of the battery 10 increases. In other words, when the battery 10 operates for 'n' cycles, the time required for the battery voltage to decrease from 100% to 0% is shorter than a time required for an initial battery voltage to decrease from 100% to 0%.

Therefore, because the battery voltage reduction time gradually decreases as a usage time of the battery 10 increases, an error occurs between the battery usable time and the initially informed total usable time.

Accordingly, the controller 110 calculates the battery voltage reduction change rate based on a difference between a current battery voltage reduction time and an initial battery voltage reduction time, and reflects the battery voltage reduction change rate in predicting the battery usable time to accurately predict the usable time.

To this end, the controller 110 may calculate the battery voltage reduction change rate based on a value obtained by dividing the battery voltage reduction time (hereinafter, referred to as a 'first battery voltage reduction time') identified from the current state information of the battery 10 by the battery voltage reduction time (hereinafter, referred to as a 'second battery voltage reduction time') identified from the initial state information of the battery 10.

As an example, assuming that the currently identified first battery voltage reduction time is 5 minutes and the initially identified second battery voltage reduction time is 10 minutes, the battery voltage reduction time required for the battery voltage to decrease by V1 is shortened by 5 minutes compared to the initial time. Accordingly, the battery voltage reduction change rate calculated from the first battery voltage reduction time and the second battery voltage reduction time becomes 0.5 (=5/10).

In this regard, the controller 110 may determine an aged state of the battery 10 based on the battery voltage reduction change rate. The controller 110 determines that the battery 10 is aged when the battery voltage reduction change rate is smaller than a preset reference value 'a'.

For example, when the battery voltage reduction change rate is smaller than 0.5, the controller 110 may determine that the battery 10 is aged. Accordingly, when the aging of the battery 10 is identified, the controller 110 outputs a notification for replacing the battery 10 via the interface 140. For an embodiment of the same, refer to FIG. 4A.

Figure 4A:
FIG. 4A is a diagram showing a battery replacement notification operation resulted from aging of the battery according to an embodiment of the present disclosure.

FIG. 4A is a diagram showing a battery replacement notification operation resulted from aging of the battery according to an embodiment of the present disclosure.

When the aging of the battery 10 is identified, the controller 110 may generate a replacement notification message 411 resulted from the aging of the battery 10 and output the message on a display screen 145 of the interface 140, as shown in FIG. 4A.

Therefore, the user may easily recognize the aged state of the battery 10 by identifying the replacement notification message 411 displayed on the display screen 145.

In one example, the controller 110 may output an alarm sound or turn on a warning light in addition to the replacement notification message 411 resulted from the aging of the battery 10.

In addition, the controller 110 may predict the battery usable time by applying the calculated battery voltage reduction change rate. For example, the controller 110 may predict the battery usable time by applying the battery voltage reduction change rate to the value obtained by dividing the state of charging of the battery 10 by the operating current.

In one example, even in a state in which the voltage of the battery has not decreased by V1, the controller 110 may also predict the battery usable time based on the state of charging of the battery and the operating current identified at the corresponding time point and the battery voltage reduction change rate identified in advance.

In this regard, the controller 110 may provide the user with information on the predicted battery usable time via the interface 140. For an embodiment of the same, refer to FIG. 4B.

Figure 4B:
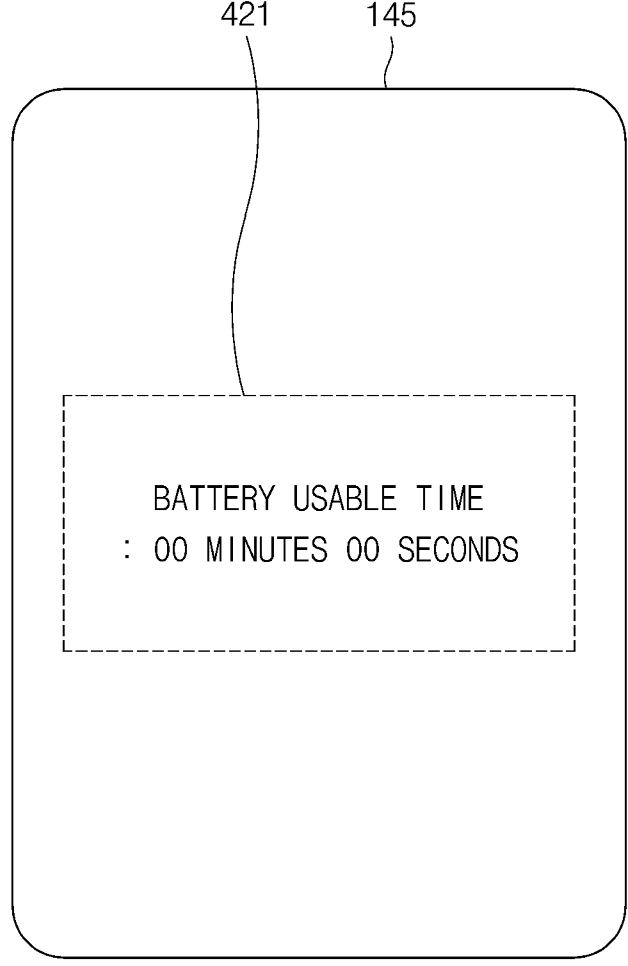
FIG. 4B is a diagram showing a battery usable time informing operation according to an embodiment of the present disclosure.

FIG. 4B is a diagram showing a battery usable time informing operation according to an embodiment of the present disclosure.

When the battery usable time is predicted, the controller 110 may generate an information message 421 for the battery usable time and output the message on the display screen 145 of the interface 140, as shown in FIG. 4B.

Therefore, the user may easily recognize the usable time of the battery 10 by identifying the information message 421 for the battery usable time displayed on the display screen 145.

In this case, because the predicted battery usable time reflects the battery voltage reduction change rate, the controller 110 may inform the user of the accurate usable time even when the voltage reduction becomes faster because of the aging of the battery 10.

An operation flow of the battery management system according to the present disclosure constituted as described above will be described in more detail as follows.

Figure 5:
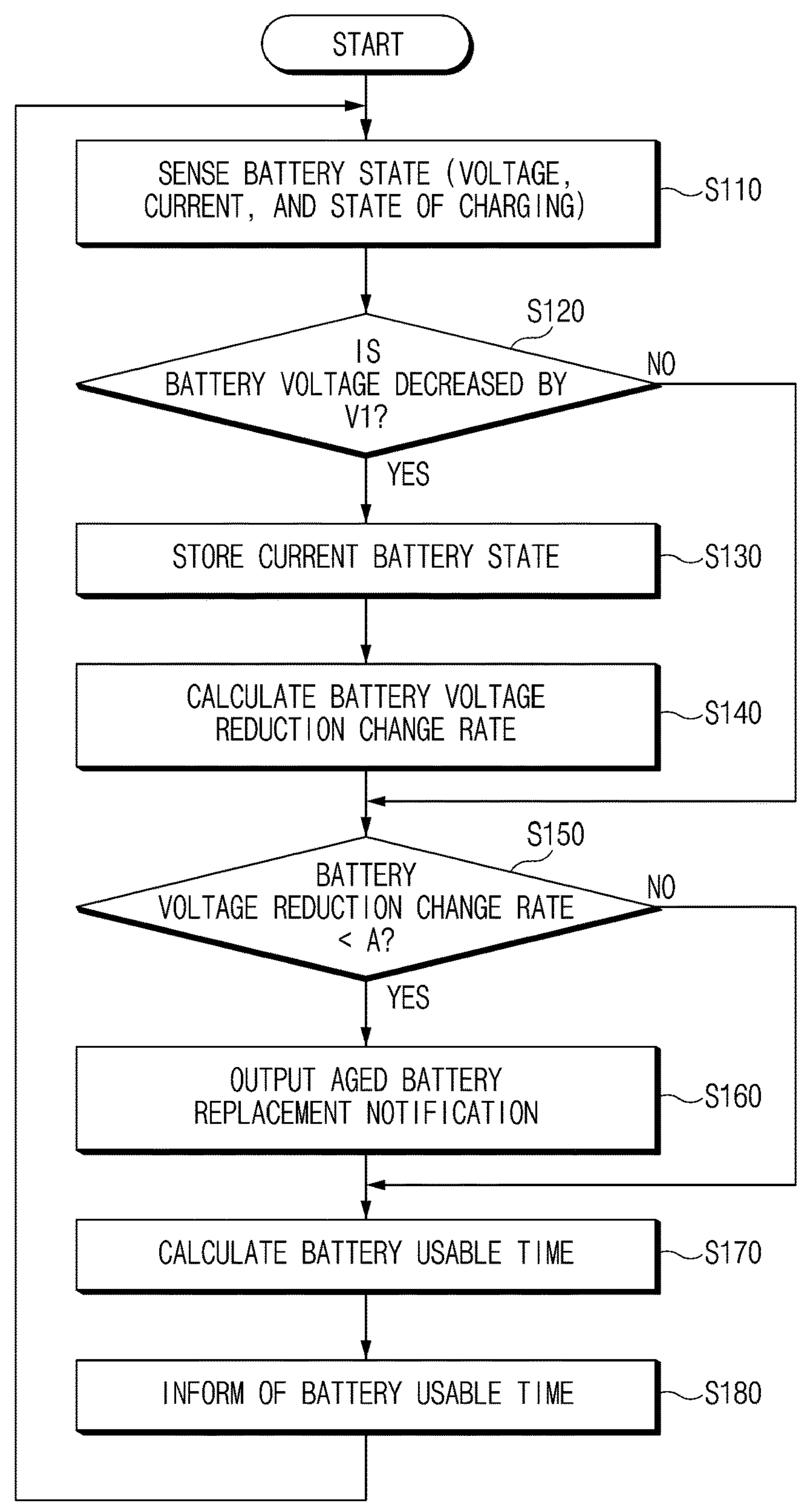
FIG. 5 is a diagram showing an operational flow of a method for controlling a battery management system according to an embodiment of the present disclosure.

FIG. 5 is a diagram showing an operational flow of a method for controlling a battery management system according to an embodiment of the present disclosure.

Referring to FIG. 5, the battery management system 100 senses and monitors the battery state information, for example, the voltage, the current, the state of charging, and the like of the battery 10 during operation (S110). In process 'S110', the battery management system 100 determined whether the voltage of the battery 10 decreases by the predetermined value V1. For example, the battery management system 100 may determine whether the voltage of the battery 10 decreases by 0.1 [V].

When the voltage of the battery 10 decreases by the predetermined value V1 (S120), the battery management system 100 stores the battery state information at the corresponding time point (S130).

Although not shown in FIG. 5, a process of storing the initial state information of the battery 10 may precede during the initial operation of the battery 10 before performing process 'S110'.

In this regard, the battery management system 100 calculates the battery voltage reduction change rate based on the current state information of the battery 10 stored in process 'S130' and the initial state information of the battery 10 stored when the battery 10 is mounted or replaced (S140). In this regard, the state information of the battery 10 may include the information on the battery voltage reduction time required for the voltage of the battery 10 to decrease by V1.

In process 'S140', the battery management system 100 may obtain the battery voltage reduction change rate based on the valued obtained by dividing the first battery voltage reduction time identified from the current state information of the battery 10 by the second battery voltage reduction time identified from the initial state information of the battery 10.

In this regard, when the battery voltage reduction change rate calculated in process 'S140' is smaller than the reference value 'a' (S150), the battery management system 100 determines that the battery 10 is aged and outputs replacement notification of the battery 10 (S160).

On the other hand, when it is identified that the battery voltage reduction change rate is equal to or greater than the reference value 'a' in process 'S150', the battery management system 100 omits process 'S160' and performs subsequent processes.

The battery management system 100 predicts the battery usable time based on the battery voltage reduction change rate calculated in process 'S140' (S170), and provides the user with the information on the battery usable time predicted in process 'S170' (S180). In process 'S170', the battery management system 100 may predict the battery usable time by applying the battery voltage reduction change rate to the value obtained by dividing the state of charging of the battery 10 by the operating current.

Thereafter, the battery management system 100 may continuously monitor the state of the battery 10 until the operation of the battery 10 is terminated (S110), and repeat processes 'S120' to 'S180' whenever the voltage of the battery 10 decreases by V1.

In one example, to continuously identify the battery usable time, even in the state in which the voltage of the battery does not decrease by V1 in process 'S120', the battery management system 100 may perform processes 'S150' to 'S180' based on the battery voltage reduction change rate identified in advance and predict and inform the battery usable time.

According to the embodiment of the present disclosure, the battery voltage reduction change rate based on the battery voltage reduction time may be continuously calculated and the battery usable time may be predicted by reflecting the calculated battery voltage reduction change rate, so that even when the voltage reduction becomes faster because of the aging of the battery, the user may be informed of the accurate usable time.

According to the embodiment of the present disclosure, the aged state of the battery may be identified based on the battery voltage reduction change rate and informed, so that the user may rapidly recognize the state of the battery.

The description above is merely illustrative of the technical idea of the present disclosure, and various modifications and changes may be made by those skilled in the art without departing from the essential characteristics of the present disclosure.

Therefore, the embodiments disclosed in the present disclosure are not intended to limit the technical idea of the present disclosure but to illustrate the present disclosure, and the scope of the technical idea of the present disclosure is not limited by the embodiments. The scope of the present disclosure should be construed as being covered by the scope of the appended claims, and all technical ideas falling within the scope of the claims should be construed as being included in the scope of the present disclosure.

What is claimed is:

1. A battery management system comprising:

a sensor configured to sense initial state information of a battery when the battery is mounted or replaced, the initial sate information including an initial battery voltage reduction time representing an amount of time required for a voltage of the battery to decrease by a specific amount;

a storage configured to store the initial state information; and one or more processors configured to:

calculate a current battery voltage reduction time representing an amount of time required for a voltage of the battery to decrease by the specific amount;

calculate a battery voltage reduction change rate based on a difference between the current battery voltage reduction time and the initial battery voltage reduction time; and predict a remaining usable time of the battery based on the battery voltage reduction change rate.

2. The battery management system of claim 1, wherein the one or more processors are configured to calculate the battery voltage reduction change rate based on a value obtained by dividing a first battery voltage reduction time identified from current state information of the battery by a second battery voltage reduction time identified from the initial state information of the battery.

3. The battery management system of claim 1, wherein the one or more processors are configured to predict the remaining usable time of the battery based on a state of charging and an operating current of the battery and the battery voltage reduction change rate.

4. The battery management system of claim 3, wherein the one or more processors are configured to predict the remaining usable time of the battery by applying the battery voltage reduction change rate to a value obtained by dividing the state of charging of the battery by the operating current of the battery.

5. The battery management system of claim 2, wherein the one or more processors are configured to determine an aged state of the battery based on the battery voltage reduction change rate.

6. The battery management system of claim 5, wherein the one or more processors are configured to determine that the battery is aged when the battery voltage reduction change rate is smaller than a reference value.

7. The battery management system of claim 6, further comprising:

an interface configured to output information on the usable time of the battery and the aged state of the battery.

8. A method for controlling a battery management system, the method comprising:

sensing, via a sensor, initial state information of a battery when the battery is mounted or replaced, the initial sate information including an initial battery voltage reduction time representing an amount of time required for a voltage of the battery to decrease by a specific amount;

storing, via a storage, the initial state information;

calculating, via one or more processors, a current battery voltage reduction time representing an amount of time required for a voltage of the battery to decrease by the specific amount;

calculating, via the one or more processors, a battery voltage reduction change rate based on a difference between the current battery voltage reduction time and the initial battery voltage reduction time; and predicting, via the one or more processors, a remaining usable time of the battery based on the battery voltage reduction change rate.

9. The method of claim 8, wherein the calculating of the battery voltage reduction change rate includes:

calculating the battery voltage reduction change rate based on a value obtained by dividing a first battery voltage reduction time identified from current state information of the battery by a second battery voltage reduction time identified from the initial state information of the battery.

10. The method of claim 8, wherein the predicting of the remaining usable time of the battery further includes:

predicting the remaining usable time of the battery based on a state of charging and an operating current of the battery and the battery voltage reduction change rate; and outputting an information message about the remaining usable time of the battery.

11. The method of claim 10, wherein the predicting of the remaining usable time of the battery based on the state of charging and the operating current of the battery and the battery voltage reduction change rate includes:

predicting the remaining usable time of the battery by applying the battery voltage reduction change rate to a value obtained by dividing the state of charging of the battery by the operating current of the battery.

12. The method of claim 8, further comprising: determining an aged state of the battery based on the battery voltage reduction change rate; and outputting a battery replacement notification message when the battery is aged.

13. The method of claim 12, wherein the determining of the aged state of the battery includes:

determining that the battery is aged when the battery voltage reduction change rate is smaller than a reference value.

* * * * *